United States Patent [19]

Tsang et al.

[11] Patent Number: 5,153,693
[45] Date of Patent: Oct. 6, 1992

[54] CIRCUIT INCLUDING BISTABLE, BIPOLAR TRANSISTOR

[75] Inventors: Won-Tien Tsang, Holmdel; Ming-Chiang Wu, Bridgewater, both of N.J.

[73] Assignee: AT&T Bell Laboratories, Murray Hill, N.J.

[21] Appl. No.: 559,530

[22] Filed: Jul. 19, 1990

Related U.S. Application Data

[63] Continuation of Ser. No. 423,076, Oct. 18, 1989, abandoned.

[51] Int. Cl.⁵ .................... H01L 29/72; H01L 27/12; H01L 29/161; H01L 27/14
[52] U.S. Cl. ............................ 357/34; 357/4; 357/16; 357/30
[58] Field of Search ............... 357/34, 16, 4 SL, 30 E

[56] References Cited

U.S. PATENT DOCUMENTS

| | | | |
|---|---|---|---|
| 4,006,366 | 2/1977 | Petrescu-Prahova | 357/16 |
| 4,503,447 | 3/1985 | Iafrate et al. | 357/4 SL |
| 4,745,446 | 5/1988 | Cheng et al. | 357/16 |
| 4,794,440 | 12/1988 | Capasso et al. | 357/16 |
| 4,801,993 | 1/1989 | Ankri et al. | 357/34 |
| 4,806,997 | 2/1989 | Simmons et al. | 357/34 |
| 4,833,511 | 5/1989 | Sugimoto | 357/30 E |
| 4,849,799 | 7/1989 | Capasso et al. | 357/16 |
| 4,878,095 | 10/1989 | Bending et al. | 357/16 |
| 4,907,196 | 3/1990 | Mori et al. | 357/16 |
| 4,926,221 | 5/1990 | Levi | 357/16 |

FOREIGN PATENT DOCUMENTS

| | | | |
|---|---|---|---|
| 63-124584 | 5/1988 | Japan | 357/4 SL |
| 63-200567 | 8/1988 | Japan | 357/16 |

Primary Examiner—Andrew J. James
Assistant Examiner—Daniel Kim
Attorney, Agent, or Firm—M. I. Finston; E. E. Pacher

[57] ABSTRACT

A bipolar transistor which is inherently bistable, is disclosed. This bipolar transistor has a structure such that the corresponding band diagram includes a first potential barrier within the collector, at or adjacent the base-collector interface. In addition, the band diagram also includes at least a second potential barrier within the collector.

11 Claims, 5 Drawing Sheets

($V_{BE}$ high)

($V_{BE}$ low)

($V_{BE}$ high)

($V_{BE}$ low)

($V_{BE}$ high)

($V_{BE}$ low)

CIRCUIT INCLUDING BISTABLE, BIPOLAR TRANSISTOR

This application is a continuation of application Ser. No. 423,076, filed on Oct. 18, 1989, now abandoned.

BACKGROUND OF THE INVENTION

1. Field of the Invention

The invention pertains to circuits which include bistable, bipolar transistors.

2. Art Background

Bipolar transistors are considered attractive for use in a variety of electronic circuits because, among other reasons, such transistors are capable of operating at significantly higher speeds than, for example, field effect transistors. On the other hand, bipolar transistors have the drawback that, in use, they require continuous electrical power, leading to significant power dissipation problems.

Included among the circuits in which bipolar transistors are employed are, for example, high speed electronic logic circuits. Such a logic circuit necessarily includes at least two (conventional) bipolar transistors to achieve the two electrical states essential to conventional binary logic. In this regard, it has been recognized that if one could achieve a bistable bipolar transistor, i.e., bipolar transistor capable of exhibiting either of two stable electrical states, then the number of bipolar transistors employed in logic circuits could be reduced by half, and therefore the cost of such circuits could be significantly reduced. Moreover, the power dissipation problems inherent in the use of the bipolar transistors would be correspondingly reduced.

A recent advance in the art of bipolar transistors has resulted in the development of what are now called resonant tunneling bipolar transistors (RTBTs). These new devices are significant because, among other reasons, and under appropriate circumstances, they exhibit two (or more) stable states. That is, an RTBT typically includes a heterojunction, and a corresponding potential barrier, at the emitter-base interface. An RTBT typically also includes at least one quantum well layer sandwiched between two potential barrier layers, within the base. (RTBTs have also been proposed in which the quantum well and the two potential barrier layers are positioned intermediate the emitter and base.) Significantly, the presence of the quantum well results in the presence of one or more quantized, discrete energy states within the quantum well. In addition, as discussed below, the presence of these energy states permits one to achieve control over the flow of electrical current from the emitter to the collector by controlling the emission process.

Assuming the Fermi level, $E_F$, in the emitter of an RTBT is below the first energy state, $E_1$, in the quantum well, then increasing the base-emitter voltage, $V_{BE}$, reduces the energy difference between $E_F$ and $E_1$. When the two levels are equal, electrons tunneling from the emitter are injected into the first energy state of the quantum well and undergo resonant tunneling (hence the name RTBT) through the two potential barriers with near unity transmission probability. A further increase in $V_{BE}$ destroys the resonance, resulting in a transmission probability which is much less than one and equal to the product of the transmission coefficients of the two barriers without the quantum well. If the quantum well is also characterized by a second, higher, discrete energy state, $E_2$, then a further appropriate increase in $V_{BE}$ will result in $E_F$ being equal to $E_2$, i.e., will result in a second resonance condition. As a result, a plot of collector current, $I_C$, versus $V_{BE}$ results in a series of peaks corresponding to the discrete energy levels of the quantum well. Over a portion of the interval between the current peaks, $I_C$ decreases with $V_{BE}$, and thus the RTBT exhibits negative differential resistance (NDR). The degree of NDR is conventionally defined in terms of the peak-to-valley ratio (PVR) in $I_C$.

As is now known, connecting an RTBT to a load resistor results in a device which exhibits two (or more) stable electrical states. That is, when the load line associated with the load resistor is superimposed upon the plot of $I_C$ versus $V_{BE}$, the two (or more) intersections of the former with the latter, where the latter has a positive slope, define the two (or more) stable states of the device. Consequently, the combination of an RTBT and a load resistor is capable of serving as a single-transistor logic and/or memory circuit.

For many applications, there is a need to achieve bistability in the absence of a load resistor. Thus, those engaged in the development of single-transistor devices have sought devices which exhibit bistability in the absence of a load resistor.

SUMMARY OF THE INVENTION

The invention involves a bipolar transistor which exhibits bistability in the absence of an external load resistor.

The inventive, bistable bipolar transistor is distinguished from, for example, the above-described RTBTs in that the flow of current from emitter to collector is controlled, and bistability is achieved, not by controlling the emission process, but rather by controlling the collection process. That is, the inventive bipolar transistor includes a first potential barrier at, or adjacent to, the base-collector interface which is introduced by, for example, employing a relatively small bandgap semiconductor material in the base and a relatively large bandgap semiconductor material in the collector. To have a significant effect on current flow, the height of this first potential barrier, at room temperature (23 degrees Centigrade (C.)) and in the absence of applied voltages, should be equal to or greater than about 1.5 kT, where k denotes Bolzmann's constant and T denotes temperature. Significantly, and by contrast with previous bipolar transistors, the collector of the inventive bipolar transistor also includes at least a second potential barrier, having a height (at room temperature and in the absence of applied voltages) which is also equal to or greater than about 1.5 kT.

Due to the presence of the second potential barrier, electrical charges accumulate in the collector of the inventive transistor, in front of the second barrier. By either allowing the accumulated charges to remain or by discharging the accumulated charges, the bipolar transistor is made to exhibit either a relatively low conductivity state or a relatively high conductivity state. That is, if, for example, the collector-emitter voltage, $V_{CE}$, is fixed, then the sum of the base-emitter voltage, $V_{BE}$, and the collector-base voltage, $V_{CB}$, is also fixed and equal to $V_{CE}$. If the applied $V_{BE}$ is relatively high, then $V_{CB}$ is necessarily relatively low. Under these circumstances, the height of the second potential barrier is not significantly affected, the accumulated electrical charges largely remain within the collector, and the bipolar transistor exhibits a relatively low conductivity state, i.e., the collector current, $I_C$, is relatively low. On the other hand, if the applied $V_{BE}$ is relatively low, then $V_{CB}$ is necessarily correspondingly high. A relatively high $V_{CB}$ serves to significantly reduce the height of the second potential barrier, which results in at least a partial discharge of the accumulated electrical charges. This, in turn, results in a lowering of the first potential barrier, and a significant increase in the flow of electrical charges from the base to the collector, i.e., a significant increase in $I_C$.

Preferably, the inventive bipolar transistor includes at least a third potential barrier with a quantum well sandwiched between the second and third barriers. An embodiment containing forty such quantum wells inteleaved between potential barriers has exhibited a PVR in $I_C$ of 15 at room temperature, which is the highest such PVR ever reported.

BRIEF DESCRIPTION OF THE DRAWING(S)

The invention is described with reference to the accompanying drawings, wherein.

Figure 9:
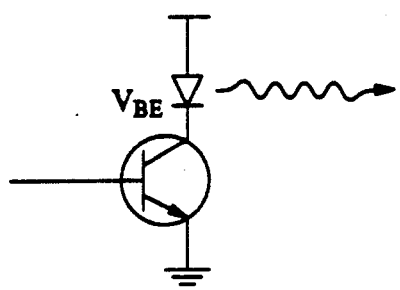
Figure 10:
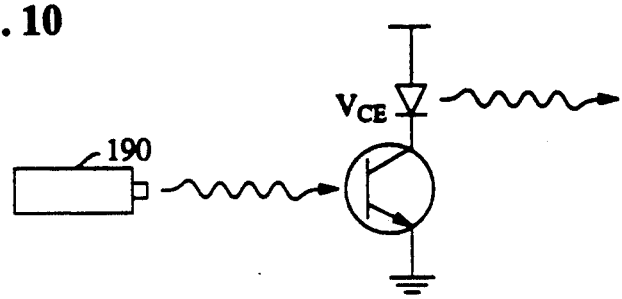

FIG. 9 is a circuit-diagram representation of an optoelectronic circuit which includes both the inventive bipolar transistor and either a semiconductor laser diode or a light emitting diode, the former serving to drive the latter; and FIG. 10 is a circuit-diagram representation of the optoelectronic circuit of FIG. 9, in which the voltage between the base and emitter of the inventive bipolar transistor is applied optically by an optical source, such as a semiconductor laser or a light emitting diode, in optical communication with the inventive transistor.

DETAILED DESCRIPTION

The invention encompasses circuits, e.g., electronic circuits and optoelectronic circuits, each of which includes at least one bipolar transistor. Significantly, this bipolar transistor exhibits bistability in the absence of a load resistor.

The bipolar transistor employed in the inventive circuits is similar to previous bipolar transistors in that it comprises an emitter, a base and a collector. In addition, the emitter includes a first semiconductor region, the base includes a second semiconductor region and the collector includes a third semiconductor region, the conductivity type of the first semiconductor region being the same as that of the third semiconductor region but opposite that of the second semiconductor region, e.g., the first and third semiconductor regions are n-type and the second semiconductor region is p-type, or vice versa. However, there are also significant differences between the inventive bipolar transistor and the previous bipolar transistor. These differences are conveniently described by reference to band diagrams, the corresponding physical structures being obvious to one of ordinary skill in the art. In this regard, FIGS. 1-6 depict the band diagrams corresponding to three embodiments of the inventive bipolar transistor. In these figures, E, B and C denote the emitter, the base and the collector regions, respectively, of the inventive transistor. In addition, CB and VB denote the corresponding conduction and valence bands.

Figure 1:
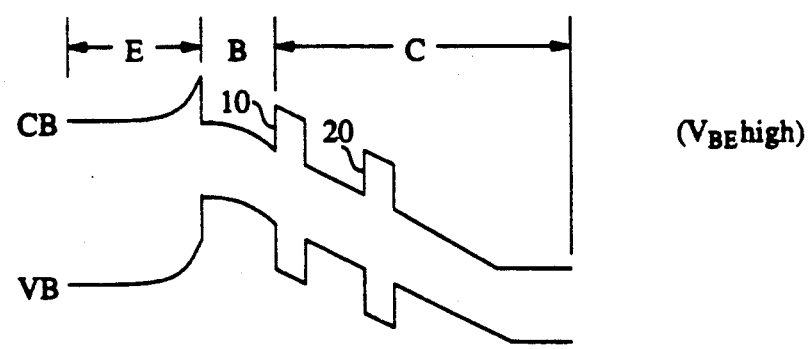
FIGS. 1, 2, 3, 4, 5 and 6 depict band diagrams corresponding to three embodiments of the inventive bipolar transistor.

With reference to FIG. 1; the band diagram corresponding to a first embodiment of the inventive transistor includes features common to all the embodiments. As shown, this first band diagram includes a potential barrier 10 within the collector at, or adjacent to, the base-collector interface. (Although the band diagram also depicts a potential barrier at the emitter base interface, this is not essential to the invention.) As is known to those skilled in the art, such a potential barrier 10 is introduced by, for example, employing a relatively small bandgap semiconductor material in the base and a relatively large bandgap semiconductor material in the collector. To have a significant effect on current flow from base to collector, i.e., on collector current, $I_C$, the potential barrier height, at room temperature (23 degrees C.) and in the absence of applied voltages, should be equal to or greater than about 1.5 kT, and preferably equal to or greater than about 5 kT, where k denotes Boltzmann's constant and T denotes temperature. By potential barrier height is meant the height above the corresponding band edge. If the transistor is npn, the relevant band edge is the conduction band edge. If the transistor is pnp, the relevant band edge is the valence band edge.

Significantly, $I_C$ is controlled, and bistability is achieved, by indirectly controlling the height of the potential barrier 10. That is, as is common to all the embodiments, the band diagram depicted in FIGS. 1 and 2 also includes a second potential barrier 20 within the collector. As is known, such a second potential barrier is introduced by, for example, altering the composition and/or doping level of the semiconductor material in the collector. The purpose of this second potential barrier is to produce an accumulation of electrical charges within the collector, in front of the second barrier, within the potential well existing between the barriers 10 and 20. To achieve a significant accumulation of electrical charges, the height of the potential barrier 20, at room temperature and in the absence of applied voltages, should also be equal to or greater than about 1.5 kT, and preferably equal to or greater than about 5 kT.

Figure 2:
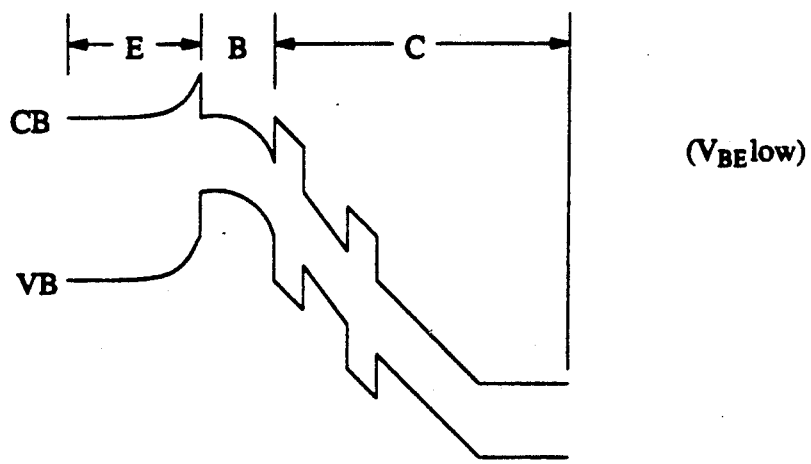

In the operation of the transistor corresponding to the band diagram depicted in FIGS. 1 and 2, the base-emitter junction is forward-biased while the collector-base junction is reverse-biased. (Consequently, if the transistor is an n-p-n transistor, the collector is biased positively relative to the emitter, while if the transistor is a p-n-p transistor, the collector is biased negatively relative to the emitter.) If the collector-emitter voltage, $V_{CE}$, is fixed, then the sum of the base-emitter voltage, $V_{BE}$, and collector-base voltage, $V_{CB}$, is also fixed and equal to $V_{CE}$. If the applied $V_{BE}$ is relatively high (the meaning of which is discussed below) $V_{CB}$ is necessarily relatively low. Under these circumstances (see FIG. 1), the height of the potential barrier 20 is sufficient to preclude any significant discharge of the accumulated electrical charges, i.e., any significant flow of electrical charges across the potential barrier 20. Moreover, most of the potential drop across the collector occurs between the potential barrier 20 and the collector contact. On the other hand, if the applied $V_{BE}$ is relatively low (the meaning of which is also discussed below), then $V_{CB}$ is necessarily correspondingly high. Significantly, a relatively high $V_{CB}$ serves to reduce the height of the second potential barrier (see FIG. 2), which results in at least a partial discharge of the accumulated electrical charges. This permits the collector-base voltage to be felt across the entire width of the collector, including the region between the potential barriers, which results in a lowering of the potential barrier 10, and a significant increase in the flow of electrical charges from the base to the collector, i.e., a significant increase in $I_C$. Thus, by appropriately varying $V_{BE}$ and, indirectly, $V_{CB}$, the inventive bipolar transistor is switched from a low conductivity state (low $I_C$) to a high conductivity state (high $I_C$).

Figure 3:
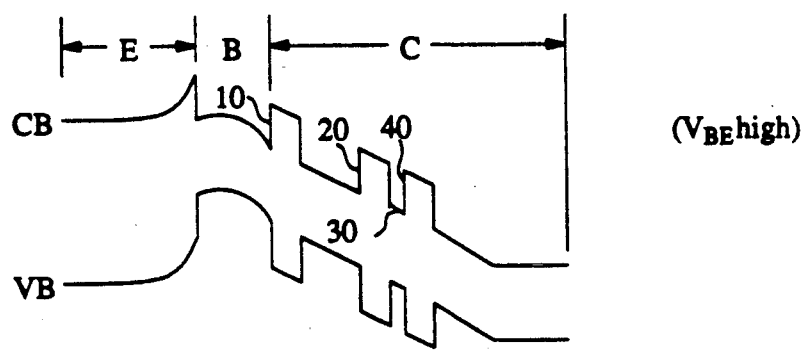

With reference to FIG. 3, the band diagram corresponding to a second embodiment of the inventive transistor includes the potential barriers 10 and 20 within the collector, as in the first embodiment. In addition, there is also a third potential barrier 40 within the collector, adjacent the potential barrier 20, with a quantum well 30 between the barriers 20 and 40. As is known, the quantum well 30 is introduced by sandwiching a relatively thin layer of relatively small bandgap semiconductor material between layers of relatively large bandgap semiconductor material corresponding to the potential barriers 20 and 40. (To achieve significant quantum size effects, the thickness of the corresponding quantum well layer is preferably equal to or less than about 0.03 micrometers ($\mu$m).) As before, the height of each of the potential barriers 10, 20 and 40, at room temperature and in the absence of applied voltages, should be equal to or greater than about 1.5 kT, and preferably equal to or greater than about 5 kT.

The presence of the two potential barriers 20 and 40 (like the presence of the potential barrier 20 in the first embodiment) results in the accumulation of electrical charges within the collector, in front of the two barriers. If $V_{BE}$ is relatively high and $V_{CB}$ is relatively low, then the potential barriers 20 and 40 are sufficiently high (see FIG. 3) to preclude any significant discharge of the accumulated electrical charges. On the other hand, if $V_{BE}$ is relatively low and $V_{CB}$ is relatively high (see FIG. 4), then the Fermi level of the accumulated charges is readily aligned with an energy eigenstate of the quantum well 40 and the accumulated charges are at least partially discharged via resonant tunneling across the potential barriers 20 and 40. This discharge results in a lowering of the potential barrier 10 and a corresponding increase in $I_C$.

Figure 5:
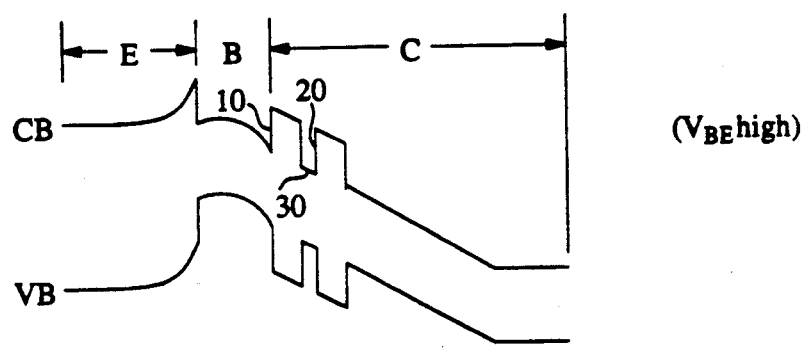
Figure 6:
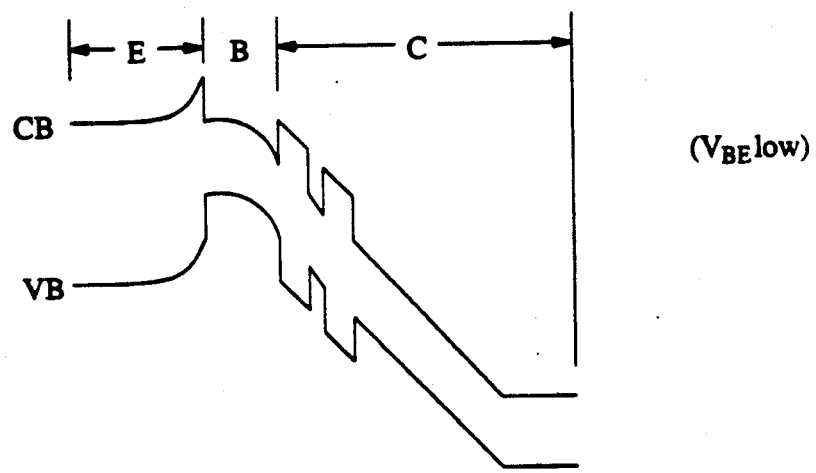

With reference to FIGS. 5 and 6, the band diagram corresponding to a third embodiment of the inventive transistor is similar to the band diagram corresponding to the first embodiment in that it includes two potential barriers 10 and 20, within the collector. As before, the height of each of the potential barriers 10 and 20, at room temperature and in the absence of applied voltages, should be equal to or greater than about 1.5 kT and preferably equal to or greater than about 5 kT. However, and by contrast with the first embodiment, the third embodiment includes a quantum well 30 between the potential barriers 10 and 20. Significantly, and by contrast with both the first and second embodiments, the presence of the potential barriers 10 and 20 results in the accumulation of electrical charges in the base. Moreover, the conductivity state of the inventive transistor is altered by applying voltages which either largely preclude discharge of the accumulated charges, or which result in discharge via resonant tunneling across the potential barriers 10 and 20.

Significantly, by virtue of the presence of the accumulated electrical charges in the collector or the base, discussed above, the inventive transistor exhibits hysteresis. This hysteretic behavior is exemplarily depicted in FIG. 7, which includes measured plots of $I_C$ versus $V_{BE}$, as well as $I_B$ (base current) versus $V_{BE}$, for an exemplary embodiment of the inventive transistor, discussed below, corresponding to the band diagram of FIGS. 3 and 4. It is by virtue of the hysteresis that bistability is achieved. That is, for the exemplary embodiment considered here, if $V_{CE}$ is fixed and equal to, for example, 1.6 volts (V), and if $V_{BE}$ is initially greater than about 1.32 V, then reducing $V_{BE}$ results in $I_C$ following the lower trajectory in the plot of $I_C$ versus $V_{BE}$. At $V_{BE}$ equal to about 1.25 V, the conductivity of the transistor, i.e., $I_C$, suddenly increases, due to the discharge of the accumulated charges. If $V_{BE}$ is then increased, $I_C$ follows the upper trajectory in the plot of $I_C$ versus $V_{BE}$. At $V_{BE}$ equal to about 1.32 V, the conductivity of the transistor suddenly decreases, due to a sufficient accumulation of electrical charges. Thus, if $V_{BE}$ is initially greater than 1.32 V, reducing $V_{BE}$ to a value equal to about 1.25 V (the relatively low voltage, referred to above) results in a switch to a relatively high conductivity state. On the other hand, increasing $V_{BE}$ to a value equal to about 1.32 V (the relatively high voltage, referred to above) results in a switch to a relatively low conductivity state.

Figure 7:
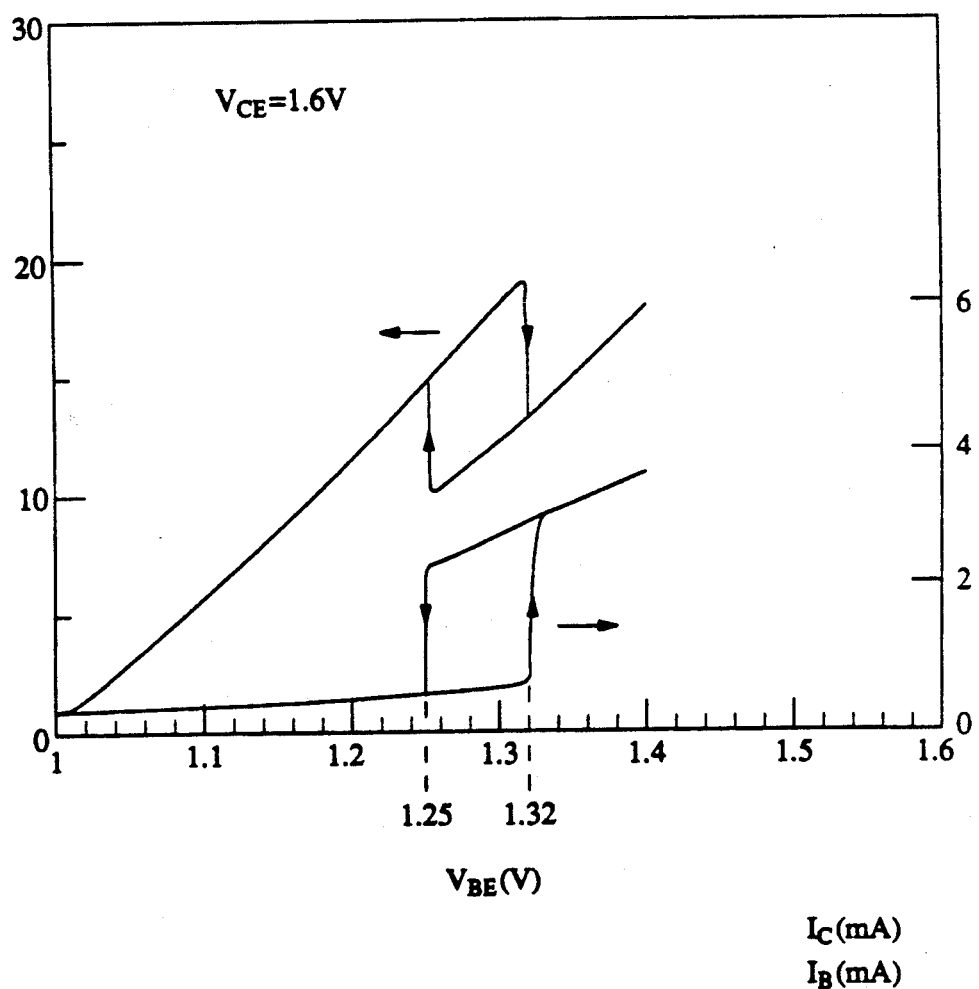
FIG. 7 depicts the hysteresis associated with an exemplary embodiment of the inventive transistor, which is typical of all the embodiments encompassed by the invention.

It should be noted that the plot of $I_B$ versus $V_{BE}$, shown in FIG. 7, also exhibits hysteresis, as is the case with all embodiments of the inventive transistor. Moreover, when $I_C$ suddenly increases from a relatively low value to a relatively high value, $I_B$ does the reverse, and vice versa.

In general, in the operation of any embodiment of the inventive transistor, the voltage range over which hysteresis occurs is initially determined. Once this voltage range is known, bistable operation is readily achieved by an appropriate choice of relatively low and relatively high voltages.

Figure 4:
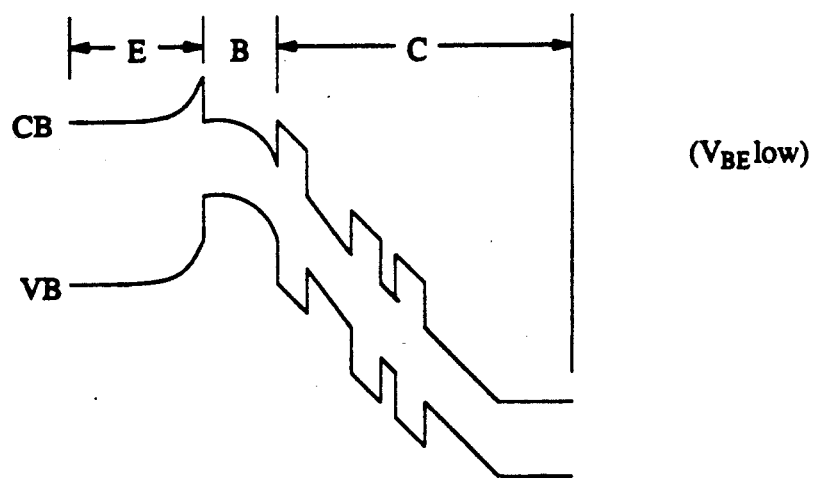
Figure 8:
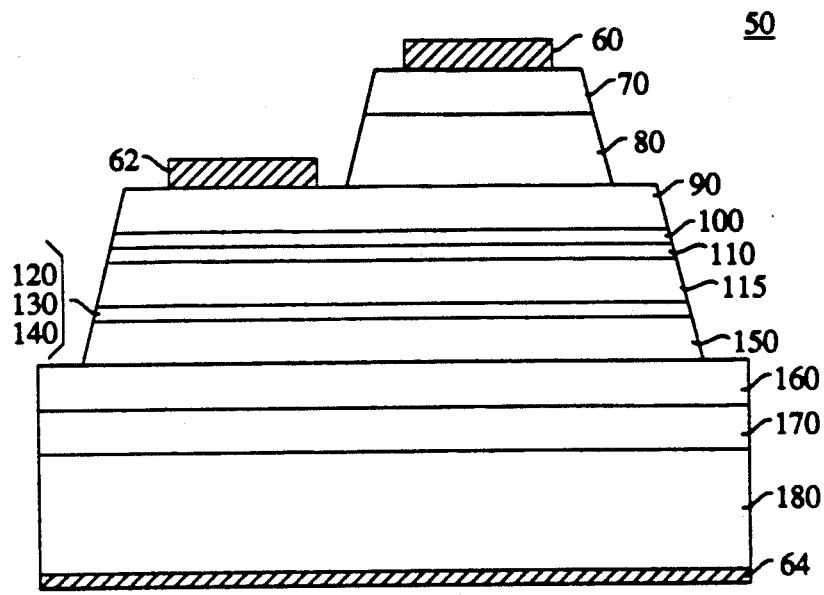
FIG. 8 is a cross-sectional view of the exemplary embodiment, referred to above.

The exemplary embodiment of the inventive transistor, referred to above, having the band diagram of FIGS. 3 and 4, is an n-p-n type transistor, and is depicted in FIG. 8. As shown, this embodiment 50 includes an n-type layer 80 of InP, which serves as the emitter. The thickness of the layer 80 is, for example, 0.3 micrometers ($\mu$m), while the concentration of n-type dopant within this layer is, for example, $5 \times 10^{17}$ cm$^{-3}$. Good electrical contact to the emitter 80 is achieved by providing an overlying contact layer 70 of n$^+$-type In$_{0.53}$Ga$_{0.47}$As having a thickness of, for example, 0.2 $\mu$m and a dopant concentration of, for example, $2 \times 10^{19}$ cm$^{-3}$.

The base of the exemplary embodiment 50 includes a p-type layer 90 of In$_{0.53}$Ga$_{0.47}$As. Preferably, the base also includes an n$^-$-type setback layer 100 of In$_{0.53}$Ga$_{0.47}$As. The former has a thickness of, for example, 0.15 $\mu$m and a corresponding dopant concentration of, for example, $2 \times 10^{18}$ cm$^{-3}$. The latter has a thickness of, for example, 0.05 $\mu$m and a corresponding dopant concentration of, for example, $3 \times 10^{16}$ cm$^{-3}$.

The collector includes an n$^-$-type layer 110 of InP, which forms a heterojunction with the base, the presence of the layer 110 resulting in the potential barrier 10 depicted in FIGS. 3 and 4. The thickness of the layer 110 is, for example, 0.05 $\mu$m, while the corresponding doping level is, for example, $3 \times 10^{16}$ cm$^{-3}$. The collector also includes a layer 115 of intrinsic In$_{0.53}$Ga$_{0.47}$As, in which charges (in this case, electrons) accumulate, as discussed above. The thickness of the layer 115 is, for example, 0.1 μm.

Significantly, the collector further includes two potential barrier layers 120 and 140 of intrinsic InP separated by a quantum well layer 130 of intrinsic $In_{0.53}Ga_{0.57}As$, corresponding to the potential barriers 20 and 40 and quantum well 30 of FIGS. 3 and 4. The thicknesses of each of these layers is, for example, 0.01 μm. In addition, the collector includes a layer 150 of intrinsic $In_{0.57}Ga_{0.43}As$ and a layer 160 of $n^+$-type $In_{0.53}Ga_{0.43}As$. The thickness of the layer 150 is, for example 0.1 μm, while the thickness of the layer 160 is, for example, 0.2 μm. The dopant concentration within the layer 160 is, for example, $2 \times 10^{19}$ cm$^{-3}$.

All of the above-described layers are readily grown on an $n^+$-type InP substrate 180, the dopant concentration within the substrate being, for example, $2 \times 10^{18}$ cm$^{-3}$. Preferably, to achieve good epitaxial growth of the various layers, a buffer layer 170 of $n^+$-type InP is initially grown on the substrate 180, the above-described layers being grown on the buffer layer. The thickness of the buffer layer 170 is, for example, 0.2 μm, while the corresponding dopant concentration is, for example, $5 \times 10^{18}$ cm$^{-3}$.

The various layers of the embodiment 50 are readily grown using conventional techniques such as metal-organic chemical vapor deposition (MOCVD), molecular beam epitaxy (MBE) and chemical beam epitaxy (CBE) techniques.

Electrical isolation between the emitter and base of the embodiment 50 is conveniently achieved by etching the various layers of the embodiment to form two mesas. As depicted in FIG. 8, the first such mesa includes the (etched) layers 70 and 80, and thus includes the emitter, while the second mesa includes the (etched) layers 90-150, and thus includes the base. The upper surfaces of the first and second mesas have areas of, for example, $2.5 \times 10^{-5}$ cm$^2$ and $1.9 \times 10^{-4}$ cm$^2$, respectively. Electrical contacts 60 and 62 to the emitter and base, respectively, are readily formed on the mesas. The electrical contact 60 includes, for example, successive layers of Ni, Ge, Au, Ag and Au, while the electrical contact 62 includes, for example, successive layers of AuBe, Ti and Au. An electrical contact to the collector is conveniently formed on the backside of the substrate 180 and includes, for example, successive layers of Ni, Ge, Au, Ag and Au.

The exemplary embodiment 50, described above, includes but a single quantum well layer 130 sandwiched between potential barrier layers 120 and 140. It must be emphasized that the invention also encompasses embodiments in which the collector includes two or more quantum well layers, interleaved between potential barrier layers. In fact, in addition to fabricating the exemplary embodiment 50, an embodiment containing forty such quantum well layers interleaved between potential barrier layers has also been fabricated. Significantly, the embodiment containing the forty quantum wells has exhibited a PVR in $I_C$ of 15 at room temperature, which is the highest ever reported.

While the exemplary embodiment 50 was formed using the InP/InGaAs material system, this same embodiment, as well as the other embodiments encompassed by the invention, are also readily fabricated in other material systems including, for example, InP/InAlGaAs, GaAs/AlGaAs and Si/SiGe.

The bistability exhibited by the inventive bipolar transistor makes it well suited for use in a variety of electronic circuits including, for example, single-transistor electronic memory circuits and electronic logic circuits. In addition, the bistability exhibited by the inventive bipolar transistor makes it well suited for use in a variety of optoelectronic circuits. For example, the inventive bipolar transistor is useful as a single-transistor driver circuit for electrically driving a semiconductor laser diode or a light emitting diode. The corresponding circuit diagram is shown in FIG. 9. Such a laser or light emitting diode is readily physically integrated with, for example, the embodiment 50 (see FIG. 8) by growing the material layers associated with the diode on the buffer layer 170, beneath the material layers constituting the inventive embodiment.

Rather than electrically altering the $V_{BE}$ applied to the base of the inventive bipolar transistor, and thereby driving a laser diode or light emitting diode, the same thing is also readily accomplished optically. That is, by impinging the inventive transistor with light which is absorbed by, for example, the base, $V_{BE}$ is readily altered as depicted in FIG. 10. Thus, when placed in optical communication with an appropriate optical source 190, such as a semiconductor laser or light emitting diode, the inventive transistor/diode combination usefully serves as an optical repeater (regenerator).

We claim:

1. A circuit, comprising at least one bipolar transistor comprising an emitter, a base, and a collector, and electrical contacts to, respectively, the emitter and collector, adapted for applying a voltage between the emitter and the collector, wherein:
   a) the emitter includes a first semiconductor region of a first conductivity type, the region having first majority carriers that are electrons if the first conductivity type is n type and holes if the first conductivity type is p type;
   b) the base includes a second semiconductor region of a second conductivity type opposite to the first conductivity type;
   c) the collector includes third and fourth semiconductor regions and between the third and fourth regions, at least a fifth semiconductor region, the base being positioned between the emitter and collector such that the base is adjacent to the third semiconductor region:
   d) the collector is capable of receiving electrical charges emitted by the emitter and transported across the base;
   e) each of the second, third, fourth, and fifth semiconductor regions has an energy band for said first majority carriers, said energy band being a conduction band if the first majority carriers are electrons and a valence band if the first majority carriers are holes, each band further having a band edge; and
   in the absence of applied voltages, the band edge of the fifth semiconductor region lies at a lower energy of first majority carriers than the band edges of the third and fourth regions;
   CHARACTERIZED IN THAT
   the third semiconductor region is of the first conductivity type; and
   the compositions of the third, fourth, and fifth semiconductor regions are selected such that at room temperature and in the absence of applied voltages, the band edge of the third region corresponds to an energy of first majority carriers at least 1.5 kT greater than the band edges of the second and fifth regions, and the band edge of the fourth region corresponds to an energy of first majority carriers at least 1.5 kT greater than the band edge of the fifth region, such that the third semiconductor region constitutes a potential barrier to the flow of electrical charges from the base to the collector, and the fourth semiconductor region constitutes a potential barrier to the flow of electrical charges across the collector.

2. The circuit of claim 1, wherein said first and third semiconductor regions are of n-type conductivity and said second semiconductor region is of p-type conductivity, and wherein, in use, said collector is electrically biased positively relative to said emitter.

3. The circuit of claim 1, wherein said first and third semiconductor regions are of p-type conductivity and said second semiconductor region is of n-type conductivity, and wherein, in use, said collector is electrically biased negatively relative to said emitter.

4. The circuit of claim 1, wherein the collector further includes, separated from the fourth semiconductor region and disposed between the fourth semiconductor region and the emitter electrical contact, a sixth semiconductor region having an energy band for said first majority carriers, the band having a band edge, the composition of the sixth region being selected such that at room temperature and in the absence of applied voltages, the band edge of the sixth region corresponds to an energy of majority carriers at least 1.5 kT greater than the band edge of the fifth region, such that the sixth region constitutes a potential barrier to the flow of electrical charges.

5. The circuit of claim 1, wherein the third semiconductor region is contactingly disposed adjacent the base.

6. The circuit of claim 1, further comprising a semiconductor laser which is electrically connected to said bipolar transistor.

7. The circuit of claim 1, further comprising a light emitting diode which is electrically connected to said bipolar transistor.

8. The circuit of claim 1, further comprising an optical source capable of optical communication with said bipolar transistor, said optical source also being capable of emitting light which is absorbed by said bipolar transistor.

9. The circuit of claim 4, wherein the collector further includes a quantum well between the fourth and sixth semiconductor regions.

10. The circuit of claim 6, further comprising an optical source capable of optical communication with said bipolar transistor, said optical source also being capable of emitting light which is absorbed by said bipolar transistor.

11. The circuit of claim 7, further comprising an optical source capable of optical communication with said bipolar transistor, said optical source also being capable of emitting light which is absorbed by said bipolar transistor.

* * * * *